(12) United States Patent
Kang et al.

(10) Patent No.: US 8,393,930 B2
(45) Date of Patent: Mar. 12, 2013

(54) ORGANIC LIGHT EMITTING DISPLAY DEVICE AND METHOD OF MANUFACTURING THE SAME TO PREVENT DAMAGE TO AN INTERLAYER

(75) Inventors: Jin-Goo Kang, Yongin (KR); Won-Jun Song, Yongin (KR); Sun-Hee Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/438,622

(22) Filed: Apr. 3, 2012

(65) Prior Publication Data

US 2012/0190144 A1 Jul. 26, 2012

Related U.S. Application Data

(62) Division of application No. 12/228,727, filed on Aug. 14, 2008, now abandoned.

(30) Foreign Application Priority Data

Feb. 12, 2008 (KR) .................. 10-2008-0012610

(51) Int. Cl.
*H01L 51/56* (2006.01)
*H05B 33/00* (2006.01)
*H05B 33/04* (2006.01)

(52) U.S. Cl. ............ 445/24; 445/25; 313/504; 313/506; 313/512; 428/690

(58) Field of Classification Search .................. None
See application file for complete search history.

(56) References Cited

U.S. PATENT DOCUMENTS 7,365,487 B2 * 4/2008 Matsuura et al. ............. 313/506
2002/0011783 A1 1/2002 Hosokawa
2002/0033664 A1 3/2002 Kobayashi
2003/0113581 A1 6/2003 Gotou
2004/0140760 A1 7/2004 Chang et al.
2004/0232833 A1 11/2004 Menda et al.
2005/0029936 A1 2/2005 Kim
2006/0158095 A1 * 7/2006 Imamura ..................... 313/500
2007/0013293 A1 1/2007 Cok
2007/0090340 A1 4/2007 Lee
2007/0139606 A1 6/2007 Kim et al.
2007/0181872 A1 8/2007 Lee et al.
2007/0194711 A1 8/2007 Matsuura et al.

FOREIGN PATENT DOCUMENTS

KR 1020060056811 A 5/2006
KR 100707602 B1 4/2007

OTHER PUBLICATIONS

Korean Registration Determination Certificate issued on Aug. 14, 2009 by the Korean Intellectual Property Office in connection with corresponding Korean Patent Application No. 2008-0012610.
Office Action dated Mar. 13, 2009 in Korean Patent Application No. KR 10-2008-0012610.

* cited by examiner

*Primary Examiner* — Sikha Roy
(74) *Attorney, Agent, or Firm* — Knobbe Martens Olson & Bear LLP

(57) ABSTRACT

An organic light emitting display device prevents damage to an interlayer including an emitting layer and reduces IR drop in face electrodes, and a method of manufacturing the same. The organic light emitting display device includes: a substrate; a pixel electrode disposed on the substrate; an interlayer comprising an emitting layer disposed on the pixel electrode; a face electrode on the interlayer; and a sealing member disposed on the face electrodes, wherein the sealing member and the face electrode are bent along a curve of an upper portion of a layer below the face electrode so as to prevent a gap between the sealing member and the face electrode, and between the face electrode and the layer below the face electrode.

16 Claims, 8 Drawing Sheets

ORGANIC LIGHT EMITTING DISPLAY DEVICE AND METHOD OF MANUFACTURING THE SAME TO PREVENT DAMAGE TO AN INTERLAYER

CROSS-REFERENCE TO RELATED PATENT APPLICATION

This application is a divisional of U.S. patent application Ser. No. 12/228,727, filed on Aug. 14, 2008, which claims the benefit of Korean Patent Application No. 10-2008-0012610, filed on Feb. 12, 2008 in the Korean Intellectual Property Office, the entire disclosures of which are incorporated by reference herein.

BACKGROUND

1. Technical Field

The present disclosure relates to an organic light emitting display device and a method of manufacturing the same, and more particularly, to an organic light emitting display device capable of preventing an interlayer comprising an emitting layer from damage and reducing a current resistance (IR) drop in face electrodes, and a method of manufacturing the same.

2. Description of the Related Technology

In general, organic light emitting display devices are flat display devices in which an organic light emitting device having an interlayer is included as a display device. The interlayer includes pixel electrodes, face electrodes facing the pixel electrodes, and an emitting layer disposed between the pixel electrodes and the face electrodes.

In order to form a typical organic light emitting display device, the pixel electrodes are first formed, the interlayer including the emitting layer is formed on the pixel electrodes, and then, the face electrodes comprising metal thin films (for example, Ag and Al) are formed on the interlayer. In a structure where light generated from the emitting layer is emitted outside through the face electrodes, light transmission of the face electrodes should be high. Thus, if the face electrodes comprise transparent electrodes such as indium tin oxide (ITO), the interlayer may be damaged by sputtering during formation of the ITO transparent electrodes. Also, if the face electrodes comprise polymer electrodes, the interlayer may be easily damaged by moisture since formation of the polymer electrodes involves a wet process. Thus, face electrodes are typically formed as thin films on the interlayer by deposition of, for example, Ag. However, in such organic light emitting display devices, the face electrodes are thin films and thus an IR drop therein is often large.

SUMMARY

Some embodiments provide an organic light emitting display device capable of preventing an interlayer including an emitting layer from being damaged and reducing a current resistance (IR) drop in face electrodes, and a method of manufacturing the same.

Some embodiments provide an organic light emitting display device and a method for manufacturing the same. Embodiments of the organic light emitting display device comprise a lower substrate and an upper substrate. The lower substrate comprises a substrate, a pixel electrode disposed on the substrate, and an interlayer comprising an emitting layer disposed on the pixel electrode. The upper substrate comprises a face electrode disposed on a sealing member. The face electrode of the upper substrate is disposed on an upper surface of the lower substrate. The face electrode and sealing member conform to the upper surface of the lower substrate with no gap between the face electrode and the upper surface of the lower substrate, and no gap between the sealing member and the face electrode. In some embodiments, the lower substrate and upper substrate are manufactured separately, then joined using pressure and/or heat. Embodiments of the organic light emitting display device exhibit at least one of reduced damage to the emitting layer and reduced IR drop in the face electrode.

One aspect provides an organic light emitting display device including: a substrate; a pixel electrode disposed on the substrate; an interlayer comprising an emitting layer disposed on the pixel electrode; a face electrode on the interlayer; and a sealing member disposed on the face electrodes, wherein the sealing member and the face electrode are bent along a curve of an upper portion of a layer below the face electrode so as to prevent a gap between the sealing member and the face electrode and between the face electrode and the layer below the face electrode.

The face electrode may be formed of transparent conductive oxides or conductive polymers.

The device may further include a pixel defining layer to cover an edge of the pixel electrode so as to expose the center of the pixel electrode, wherein the interlayer is disposed on a portion of the pixel electrode, the portion being exposed by the pixel defining layer, and wherein the face electrode is bent along the upper surface of the interlayer and the upper surface of the pixel defining layer so as to prevent a gap between the face electrode and the interlayer and between the face electrode and the pixel defining layer.

The substrate may be flexible.

The device may further include a patterned auxiliary electrode disposed on the face electrode, wherein the sealing member is bent along a curve of an upper portion of a layer below the sealing member so as to prevent a gap between the sealing member and the face electrode and between the patterned auxiliary electrode and the face electrode.

The patterned auxiliary electrode may be formed of conductive transparent oxides or conductive polymers.

The device may further include a pixel defining layer to cover edge of the pixel electrode so as to expose the center of the pixel electrode, wherein the interlayer is disposed on a portion of the pixel electrode, the portion being exposed by the pixel defining layer, and wherein the face electrode is bent along the upper surface of the interlayer and the upper surface of the pixel defining layer so as to prevent a gap between the face electrode and the interlayer and between the face electrode and the pixel defining layer.

The patterned auxiliary electrode may be patterned to correspond to the upper surface of the pixel defining layer.

The patterned auxiliary electrode may include opaque materials.

Another aspect provides a method of manufacturing an organic light emitting display device, the method including: (a) forming a pixel electrode on a substrate and forming interlayer comprising an emitting layer on the pixel electrode; (b) forming a conductive layer on a flexible sealing member; (c) positioning the flexible sealing member and the substrate so that the conductive layer faces the interlayer and bending the flexible sealing member and the conductive layer along a curve of an upper portion of a layer below the conductive layer at high temperature and high pressure so as to prevent a gap between the conductive layer and the layer below the conductive layer.

The conductive layer may be formed of transparent conductive oxides or conductive polymers.

Step (a) may include forming a pixel defining layer to cover edge of the pixel electrode so as to expose the center of the pixel electrode, before forming the interlayer and step (c) comprises bending the flexible sealing member so as to prevent a gap between the conductive layer and the interlayer and between the conductive layer and the pixel defining layer.

Another aspect provides a method of manufacturing an organic light emitting display device, the method including: (a) forming a pixel electrode on a substrate, forming an interlayer comprising an emitting layer on the pixel electrode, and forming a face electrode on the interlayer; (b) forming a patterned conductive layer on a flexible sealing member; (c) positioning the flexible sealing member and the substrate so that the patterned conductive layer faces the face electrode and bending the flexible sealing member along a curve of an upper portion of a layer below the flexible sealing member at high temperature and high pressure so as to prevent a gap between the flexible sealing member and the face electrode and between the patterned conductive layer to and the face electrode.

The patterned conductive layer may be formed of transparent conductive oxides or conductive polymers.

Step (a) may include forming a pixel defining layer to cover edge of the pixel electrode so as to expose the center of the pixel electrode, before forming the interlayer and step (c) comprises bending the flexible sealing member so as to prevent a gap between the flexible sealing member and the face electrode and between the flexible sealing member and the pixel defining layer.

The patterned conductive layer may be patterned to correspond to the upper surface of the pixel defining layer.

The patterned conductive layer may include opaque materials.

Another aspect provides a method of manufacturing an organic light emitting display device, the method including: (a) forming a pixel electrode on a substrate, forming an interlayer comprising an emitting layer on the pixel electrode, and forming a face electrode on the interlayer; (b) forming a patterned conductive layer on a flexible sealing member; (c) positioning the flexible sealing member and the substrate so that the patterned conductive layer faces the face electrode and heating the flexible sealing member so that the flexible sealing member are bent along a curve of an upper portion of a layer below the flexible sealing member so as so as to prevent a gap between the flexible sealing member and the face electrode and between the patterned conductive layer and the face electrode.

The conductive layer may be formed of transparent conductive oxides or conductive polymers.

Step (a) may include forming a pixel defining layer to cover edge of the pixel electrode so as to expose the center of the pixel electrode, before forming the interlayer and step (c) comprises bending the flexible sealing member so as to prevent a gap between the flexible sealing member and the face electrode and between the flexible sealing member and the pixel defining layer.

Another aspect provides a method of manufacturing an organic light emitting display device, the method including: (a) forming a pixel electrode on a substrate, forming an interlayer comprising an emitting layer on the pixel electrode, and forming a face electrode on the interlayer; (b) forming a patterned conductive layer on a flexible sealing member; (c) positioning the flexible sealing member and the substrate so that the patterned conductive layer faces the face electrode and heating the flexible sealing member so that the flexible sealing member are bent along a curve of an upper portion of a layer below the flexible sealing member so as so as to prevent a gap between the flexible sealing member and the face electrode and between the patterned conductive layer and the face electrode.

The patterned conductive layer may be formed of transparent conductive oxides or conductive polymers.

Step (a) may include forming a pixel defining layer to cover edge of the pixel electrode so as to expose the center of the pixel electrode, before forming the interlayer and step (c) comprises bending the flexible sealing member so as to prevent a gap between the flexible sealing member and the face electrode and between the flexible sealing member and the pixel defining layer.

The patterned conductive layer may be patterned to correspond to the upper surface of the pixel defining layer.

The patterned conductive layer may include opaque materials.

Some embodiments provide an organic light emitting display device comprising: a substrate; a pixel electrode disposed on the substrate; an interlayer comprising an emitting layer disposed on the pixel electrode; a face electrode disposed on the interlayer; and a sealing member disposed on the face electrode, wherein the sealing member and the face electrode conform to an upper surface of a layer below the face electrode with substantially no gap between the sealing member and the face electrode, and between the face electrode and the layer below the face electrode.

In some embodiments, the face electrode comprises a transparent conductive oxide or a conductive polymer.

Some embodiments further comprise a pixel defining layer covering an edge of the pixel electrode and exposing a center of the pixel electrode, wherein the interlayer is disposed on a portion of the pixel electrode exposed by the pixel defining layer, and wherein the face electrode conforms to an upper surface of the interlayer and an upper surface of the pixel defining layer with substantially no gap between the face electrode and the interlayer, and between the face electrode and the pixel defining layer.

In some embodiments, the substrate is flexible.

Some embodiments further comprise a patterned auxiliary electrode disposed on the face electrode, wherein the sealing member conforms to an upper surface of a layer below the sealing member with substantially no gap between the sealing member and the face electrode, and between the patterned auxiliary electrode and the face electrode. In some embodiments, the patterned auxiliary electrode comprises a conductive transparent oxide or conductive polymer.

Some embodiments further comprise a pixel defining layer covering an edge of the pixel electrode and exposing a center of the pixel electrode, wherein the interlayer is disposed on a portion of the pixel electrode exposed by the pixel defining layer, and wherein the face electrode conforms to an upper surface of the interlayer and an upper surface of the pixel defining with no gap between the face electrode and the interlayer, and between the face electrode and the pixel defining layer. In some embodiments, a pattern of the patterned auxiliary electrode corresponds to the upper surface of the pixel defining layer. In some embodiments, the patterned auxiliary electrode comprises an opaque material.

Some embodiments provide a method of manufacturing an organic light emitting display device, the method comprising: (a) forming a pixel electrode on a substrate and forming an interlayer comprising an emitting layer on the pixel electrode; (b) forming a conductive layer on a flexible sealing member; and (c) positioning the flexible sealing member and the substrate with the conductive layer facing the interlayer, and reshaping the flexible sealing member and the conductive layer to conform to an upper surface of a layer below the conductive layer at high temperature and high pressure, thereby substantially eliminating a gap between the conductive layer and the layer below the conductive layer.

In some embodiments, the conductive layer comprises a transparent conductive oxide or a conductive polymer.

In some embodiments, step (a) comprises forming a pixel defining layer covering an edge of the pixel electrode and exposing a center of the pixel electrode before forming the interlayer, and step (c) comprises reshaping the flexible sealing member to prevent or eliminate a gap between the conductive layer and the interlayer, and between the conductive layer and the pixel defining layer.

Some embodiments provide a method of manufacturing an organic light emitting display device, the method comprising: (a) forming a pixel electrode on a substrate and forming an interlayer comprising an emitting layer on the pixel electrode; (b) forming a conductive layer on a flexible sealing member; and (c) positioning the flexible sealing member and the substrate with the conductive layer facing the interlayer, and heating the flexible sealing member so that the flexible sealing member and the conductive layer conform to an upper surface of a layer below the conductive layer, thereby substantially eliminating a gap between the conductive layer and the layer below the conductive layer.

In some embodiments, the conductive layer comprises a transparent conductive oxide or a conductive polymer.

In some embodiments, step (a) comprises forming a pixel defining layer covering an edge of the pixel electrode and exposing a center of the pixel electrode before forming the interlayer, and step (c) comprises reshaping the flexible sealing member to prevent or eliminate a gap between the conductive layer and the interlayer, and between the conductive layer and the pixel defining layer.

Some embodiments provide a method of manufacturing an organic light emitting display device, the method comprising: (a) forming a pixel electrode on a substrate, forming an interlayer comprising an emitting layer on the pixel electrode, and forming a face electrode on the interlayer; (b) forming a patterned conductive layer on a flexible sealing member; and (c) positioning the flexible sealing member and the substrate with the patterned conductive layer facing the face electrode, and reshaping the flexible sealing member to conform to an upper surface of a layer below the flexible sealing member at high temperature and high pressure with substantially no gap between the flexible sealing member and the face electrode, and between the patterned conductive layer to and the face electrode.

In some embodiments, the patterned conductive layer comprises a transparent conductive oxide or a conductive polymer.

In some embodiments, step (a) comprises forming a pixel defining layer covering an edge of the pixel electrode and exposing a center of the pixel electrode before forming the interlayer, and step (c) comprises reshaping the flexible sealing member to prevent or eliminate a gap between the flexible sealing member and the face electrode, and between the flexible sealing member and the pixel defining layer.

In some embodiments, a pattern of the patterned conductive layer corresponds to an upper surface of the pixel defining layer. In some embodiments, the patterned conductive layer comprises an opaque material.

Some embodiments provide a method of manufacturing an organic light emitting display device, the method comprising: (a) forming a pixel electrode on a substrate, forming an interlayer comprising an emitting layer on the pixel electrode, and forming a face electrode on the interlayer; (b) forming a patterned conductive layer on a flexible sealing member; and (c) positioning the flexible sealing member and the substrate with the patterned conductive layer facing the face electrode, and heating the flexible sealing member, thereby reshaping the flexible sealing member to conform to an upper surface of a layer below the flexible sealing member with substantially no gap between the flexible sealing member and the face electrode, and between the patterned conductive layer and the face electrode.

In some embodiments, the patterned conductive layer comprises a transparent conductive oxide or a conductive polymer.

In some embodiments, step (a) comprises forming a pixel defining layer covering an edge of the pixel electrode and exposing a center of the pixel electrode before forming the interlayer, and step (c) comprises reshaping the flexible sealing member with substantially no gap between the flexible sealing member and the face electrode, and between the flexible sealing member and the pixel defining layer.

In some embodiments, a pattern of the patterned conductive layer corresponds to the upper surface of the pixel defining layer. In some embodiments, the patterned conductive layer comprises an opaque material.

BRIEF DESCRIPTION OF THE DRAWINGS

The above and other features and advantages will become more apparent by describing in detail exemplary embodiments thereof with reference to the attached drawings in which.

DETAILED DESCRIPTION OF CERTAIN EMBODIMENTS

Hereinafter, certain embodiments will be described more fully with reference to the accompanying drawings, in which exemplary embodiments are shown.

Figure 1:
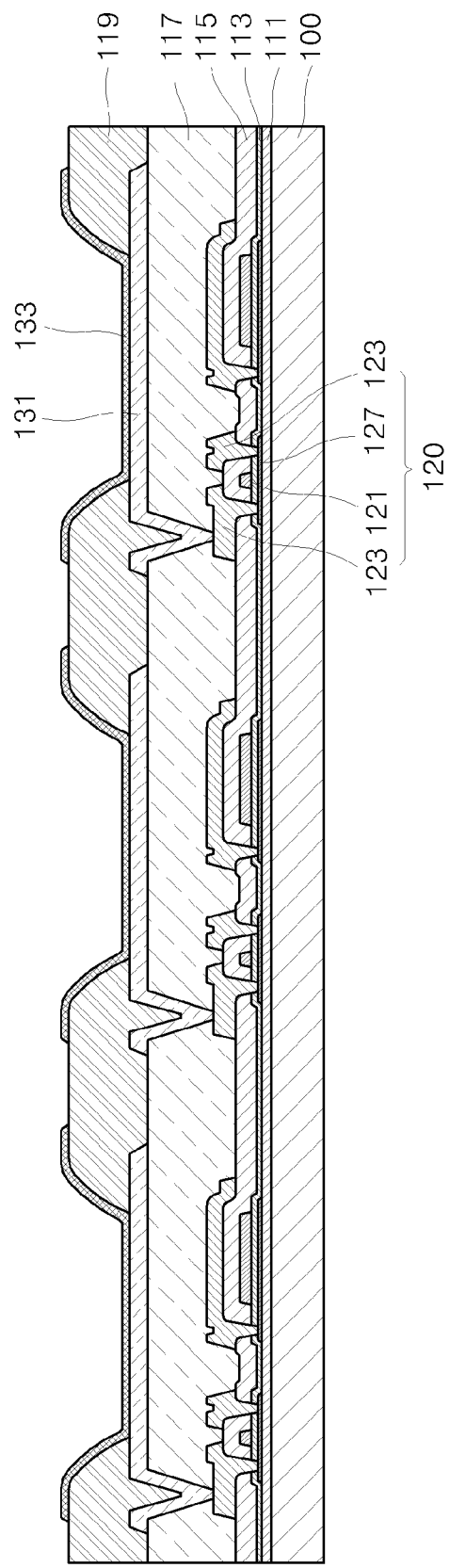
FIGS. 1 through 4 are cross-sectional views schematically illustrating an embodiment of a method of manufacturing an organic light emitting display device.

FIGS. 1 through 4 are cross-sectional views schematically illustrating an embodiment of a method of manufacturing an organic light emitting display device. Referring to FIG. 1, a pixel electrode 131 is formed on a substrate 100. The substrate 100 may comprise glass or various kinds of plastics such as acrylic. Moreover, the substrate 100 may also be a metal substrate. The substrate 100 may further include a buffer layer (not shown) disposed thereon, if desired.

As illustrated in FIG. 1, various layers, such as those that together comprise a thin film transistor 120, may be formed on the substrate 100 before the pixel electrode 131 is formed. As shown in FIG. 1, the thin film transistor 120 including a gate electrode 121, source and drain electrodes 123, a semiconductor layer 127, a gate insulation film 113, and an interlayer insulation film 115 are disposed on the substrate 100. The thin film transistor 120 is not limited to the structure described above and various kinds of thin film transistors are used in other embodiments, such as organic thin film transistors and silicon thin film transistors, which respectively comprise an organic material and silicon in the semiconductor layer 127. A buffer layer (not shown) comprising silicon oxide or silicon nitride may be further disposed between the thin film transistor 120 and the substrate 100, if desired.

The pixel electrode 131 is electrically connected to the thin film transistor 120. The pixel electrode 131 may be a transparent electrode or a reflective electrode. The transparent electrode may comprise indium tin oxide (ITO), indium zinc oxide (IZO), zinc oxide (ZnO), aluminum zinc oxide (AZO) and/or indium (III) oxide ($In_2O_3$). The reflective electrode may include a reflective film comprising Ag, Mg, Al, Pt, Pd, Au, Ni, Nd, Ir, Cr, and/or a compound thereof, and a film comprising ITO, IZO, ZnO, and/or $In_2O_3$ disposed on the reflective film.

Also, a pixel defining layer (PDL) 119 covers the edge of the pixel electrode 131 and extends outward or away from the pixel electrode 131. The PDL 119 defines a light emitting area.

An interlayer 133 including at least an emitting layer is disposed on the pixel electrode 131. The interlayer 133 may comprise low molecular weight substances and/or polymers.

When low molecular weight substances are used, a hole injection layer (HIL), a hole transport layer (HTL), an emission layer (EML), an electron transport layer (ETL), and an electron injection layer (EIL) are sequentially stacked as a single layer or as a complex layer. Also, various materials including copper phthalocyanine (CuPc), N,N'-di(naphthalene-1-yl)-N,N'-diphenyl-benzidine (NPB), and tris-8-hydroxyquinoline aluminum ($Alq_3$) may be used. These low molecular weight substances may be deposited by vacuum deposition using masks.

An interlayer 133 comprising polymers may comprise an HTL and an EML. A polymer such as PEDOT may be used as the HTL and the polymers such as poly-phenylenevinylene (PPV) and polyfluorene may be used as the EML.

The pixel electrode 131 is electrically connected to the thin film transistor 120 disposed therebelow. In embodiments comprising a planarization film 117 covering the thin film transistor 120, the pixel electrode 131 is formed on the planarization film 117 and is electrically connected to the thin film transistor 120 through a contact hole through the planarization film 117.

As such, the pixel electrode 131 is formed on the substrate 100 and the interlayer 133 including the emitting layer is formed on the pixel electrode 131, thereby forming a lower substrate, as shown in FIG. 1.

Figure 2:
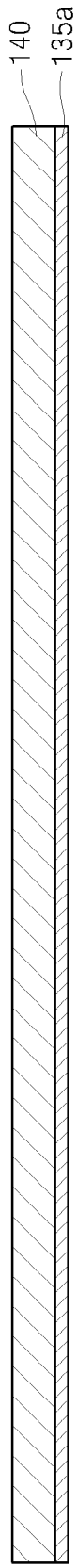

In addition, an upper substrate is illustrated in cross section in FIG. 2. The upper substrate comprises a sealing member 140 and a conductive layer 135a disposed on the sealing member 140. The sealing member 140 is flexible and can be bent by heat and/or pressure, and may comprise polyimide (PI), polyether sulfone (PES), polyethylene terephthalate (PET), polyethylene naphthalate (PEN), and/or polycarbonate (PC). Various flexible conductive materials, in addition to the above materials, can be also used to form the sealing member 140. The conductive layer 135a disposed on the flexible sealing member 140 may include transparent electrodes or reflective electrodes. When transparent electrodes are used, an auxiliary electrode line or a BUS electrode line comprising transparent-electrode materials such as ITO, IZO, ZnO, and/or $In_2O_3$ may be formed on the sealing member 140 and a film comprising Li, Ca, LiF/Ca, LiF/Al, Al, Mg, polymer, and/or a compound thereof may cover the auxiliary electrode line or the BUS electrode line. The reflective electrodes may comprise Al, Ag, Ni, Au, Pt, Pd, Zn, Sn, Cu, Ti, Mo, Li, Ca, LiF/Ca, LiF/Al, Mg, and/or a compound thereof. When the conductive layer 135a comprises a transparent electrode such as ITO, a sputtering method may be used and when the conductive layer 135a comprises polymer, a wet process may be used.

Figure 3:
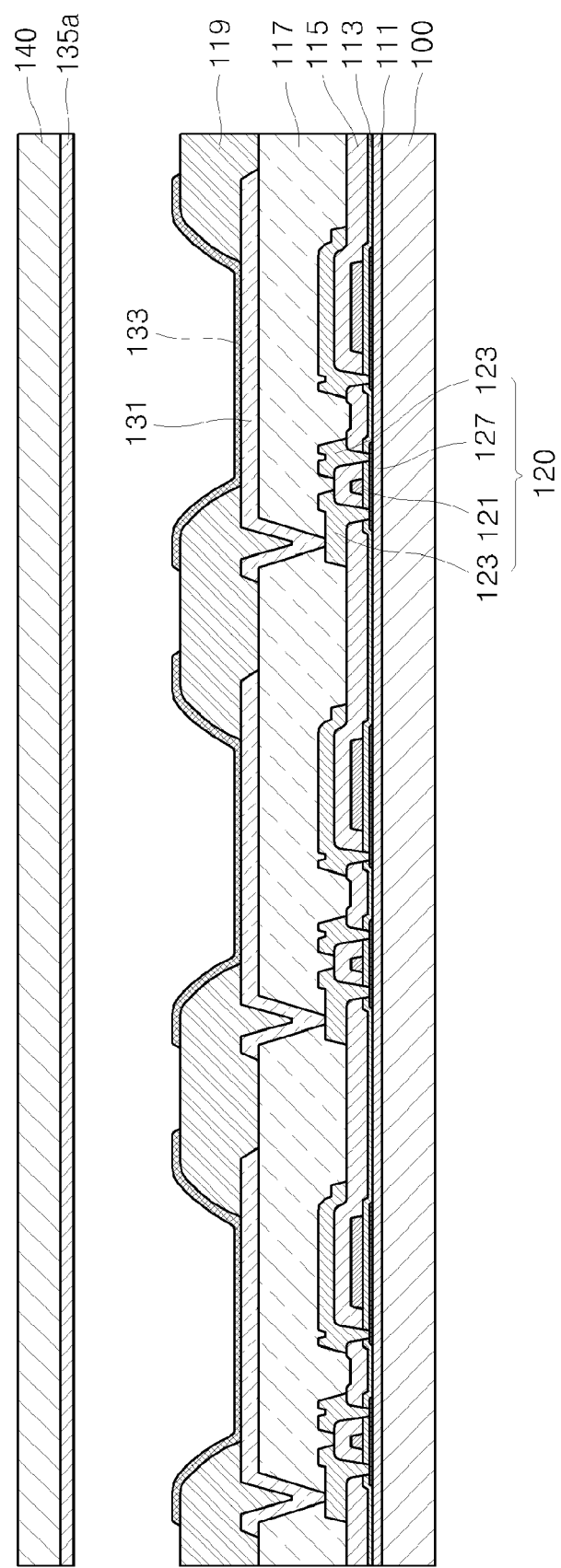
Figure 4:
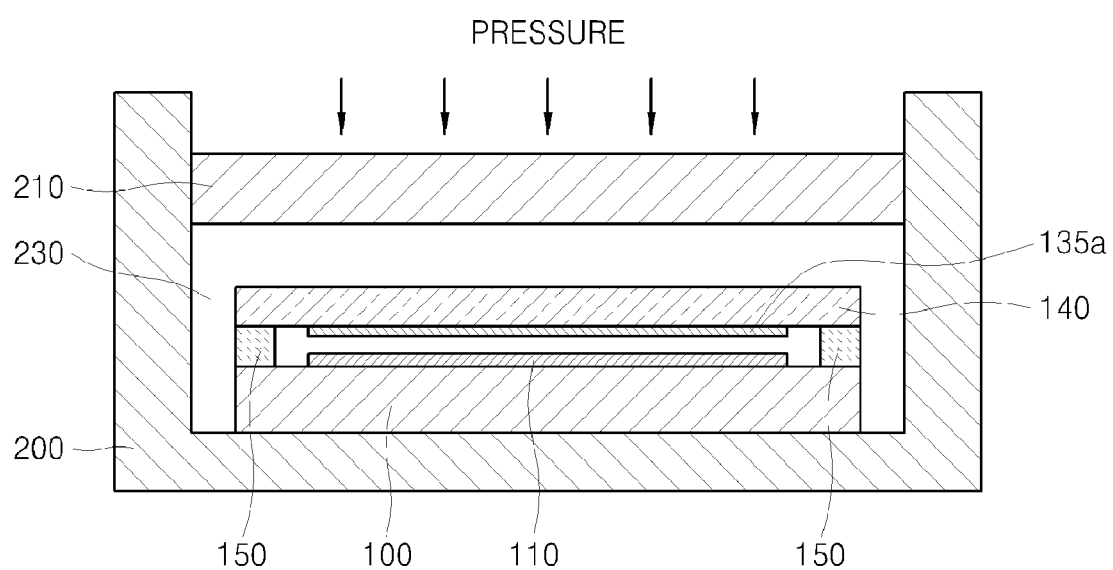

When manufacture of the upper substrate and the lower substrate is completed, the upper substrate and the lower substrate are positioned so that the conductive layer 135a of the upper substrate faces the interlayer 133 of the lower substrate, as shown in FIG. 3. Then, the flexible sealing member 140 and the conductive layer 135a can be bent to conform to the curvature of an upper portion of a layer therebelow, for example an upper surface of the lower substrate, under high pressure, thereby eliminating a gap between the conductive layer 135a and the layer below. For example, as shown in FIG. 4, the upper substrate and the lower substrate are disposed in a chamber comprising a frame 200 and a piston 210 that can be moved up and down. The piston 210 increases pressure in an inner space 230 of the chamber. Here, the inner temperature of the chamber also increases due to the use of a hot plate. Prior to this process, the substrate 100 and the sections of the flexible sealing member 140 may be bonded to each other using sealants 150 such as a sealing glass frit, if necessary.

Under the conditions shown in FIG. 4, a pressure of from about 1 $kgf/cm^2$ to about 1500 $kgf/cm^2$ and a temperature of from about 0° C. to about 150° C. can be maintained. Accordingly, the flexible sealing member 140 and the conductive layer 135a are bent to conform to the surface of the lower substrate therebelow. More specifically, the flexible sealing member 140 and the conductive layer 135a are bent to conform to the curvature or topography of the upper portion of the layer therebelow, thereby preventing or eliminating a gap between the conductive layer 135a and the layer below the conductive layer 135a. At increased temperatures, the flexible sealing member 140 and the conductive layer 135a can be bent or formed at an atmospheric pressure of 1 $kgf/cm^2$, and thus maintaining a pressure lower than atmospheric pressure is unnecessary. Meanwhile, when the substrate 100 comprises a glass material, the breaking strength of the glass substrate 100 is typically about 1500 $kgf/cm^2$. Thus, at pressures higher than about 1500 $kgf/cm^2$, the substrate 100 may be damaged. Therefore, the pressure may be maintained at about 1-1500 $kgf/cm^2$. Meanwhile, when the pressure increases, the flexible sealing member 140 and the conductive layer 135a may be conformed to the upper portion of the layer therebelow at the temperature of about 0° C. Thus, the temperature below about 0° C. is not used in some embodiments. Also, in some embodiments in which the temperature is higher than about 150° C., the interlayer 133 is damaged and thus light may not be emitted from the device. Therefore, in some embodiments, the temperature may be maintained at about 0-150° C.

When the lower substrate has the structure shown in FIG. 1, the PDL 119 covering the edge of the pixel electrode 131 may be formed before the interlayer 133 is formed so as to expose the center of the pixel electrode 131. In this case, the flexible sealing member 140 and the conductive layer 135a may be reshaped or bent by high temperature and high pressure to prevent or eliminate a gap between the conductive layer 135a and the interlayer 133, and between the conductive layer 135a and the PDL 119.

Figure 5:
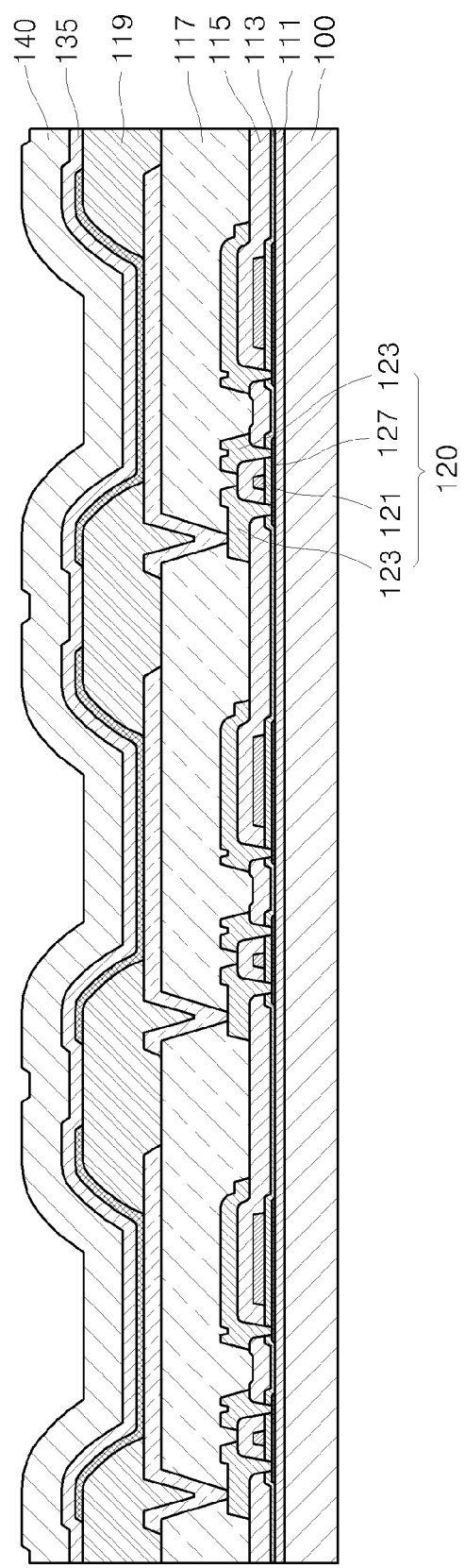
FIG. 5 is a cross-sectional view schematically illustrating another embodiment of an organic light emitting display device.

FIG. 5 is a cross-sectional view schematically illustrating the organic light emitting display device manufactured using the method described with reference to FIGS. 1-4, according to another embodiment. As shown in FIG. 5, the organic light emitting display device includes the pixel electrode 131, the interlayer 133, a face electrode 135, and the sealing member 140, wherein the pixel electrode 131 is disposed on the substrate 100, the interlayer 133 including the emitting layer is disposed on the pixel electrode 131, the face electrode 135 formed by bending or reshaping the conductive layer 135a is disposed on the interlayer 133, and the sealing member 140 is disposed on the face electrode 135. Here, the sealing member 140 and the face electrode 135 are bent or reshaped to conform to the curvature or topography of the upper portion of the layer below the face electrode 135, thereby preventing or eliminating a gap between the sealing member 140 and the face electrode 135, and between the face electrode 135 and the curve of the upper portion of the layer below the face electrode 135. Unlike a typical organic light emitting display device, the organic light emitting display device according to the current embodiment comprises a face electrode 135 that is not a thin film, and thus an IR drop observed in typical organic light emitting display devices may be remarkably reduced. In addition, even though the face electrode 135 comprises transparent conductive oxides (ITO and IZO) or conductive polymers, the face electrode 135 (conductive layer) is disposed on the sealing member 140. Thus, unlike typical organic light emitting display devices, the face electrode 135 (conductive layer) may be formed by using various methods without damaging the interlayer 133.

In addition, as the flexible sealing member 140 is used in the manufacturing process of the organic light emitting display device, the flexibility of the flexible sealing member 140 may be reduced during a bending or reshaping process performed on the flexible sealing member 140 and the conductive layer 135a, or during the subsequent processes thereof under high temperature and high pressure as shown in FIG. 4. In this case, the organic light emitting display device finally manufactured as shown in FIG. 5 may include the non-flexible sealing member 140.

Figure 6:
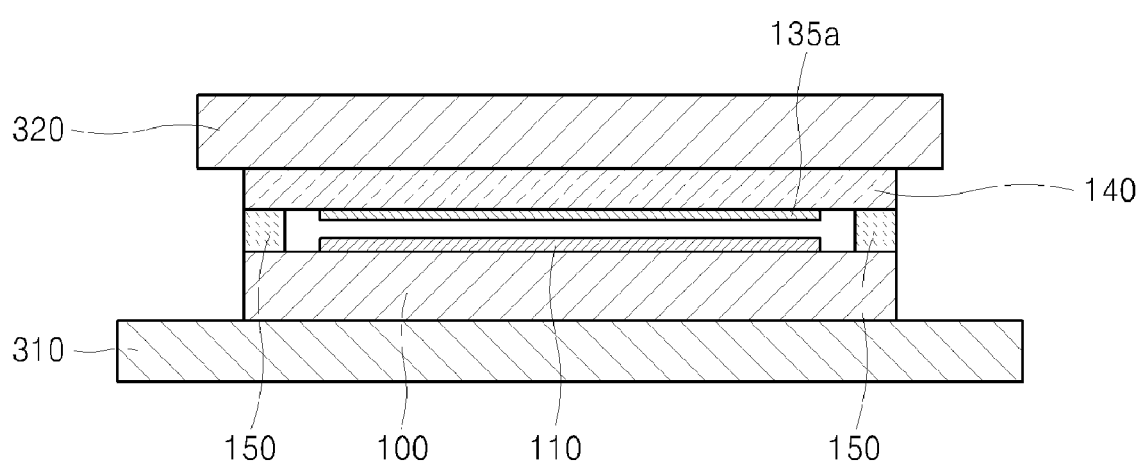
FIG. 6 is a cross-sectional view schematically illustrating another embodiment of a method of manufacturing an organic light emitting display device.

FIG. 6 is a sectional view schematically illustrating one process of a method of manufacturing an organic light emitting display device, according to another embodiment.

The upper substrate and the lower substrate are manufactured using the method described above, and the flexible sealing member 140 and the substrate 100 are positioned on a stage 310 to allow the conductive layer 135a to face the interlayer 133, as shown in FIG. 6. Then, a hot plate 320 is disposed on the flexible sealing member 140 in order to heat the flexible sealing member 140 so as to bend the flexible sealing member 140 and the conductive layer 135a to conform to the curve or surface of the upper portion of the layer below the conductive layer 135a, and thus eliminating a gap between the conductive layer 135a and the curve or surface of the upper portion of the layer below the conductive layer 135a. In FIG. 6, the hot plate 320 contacts the flexible sealing member 140 and heats the flexible sealing member 140. However, the stage 310 on which the substrate 100 is disposed may also be used as a source of heat for the flexible sealing member 140.

Figure 7:
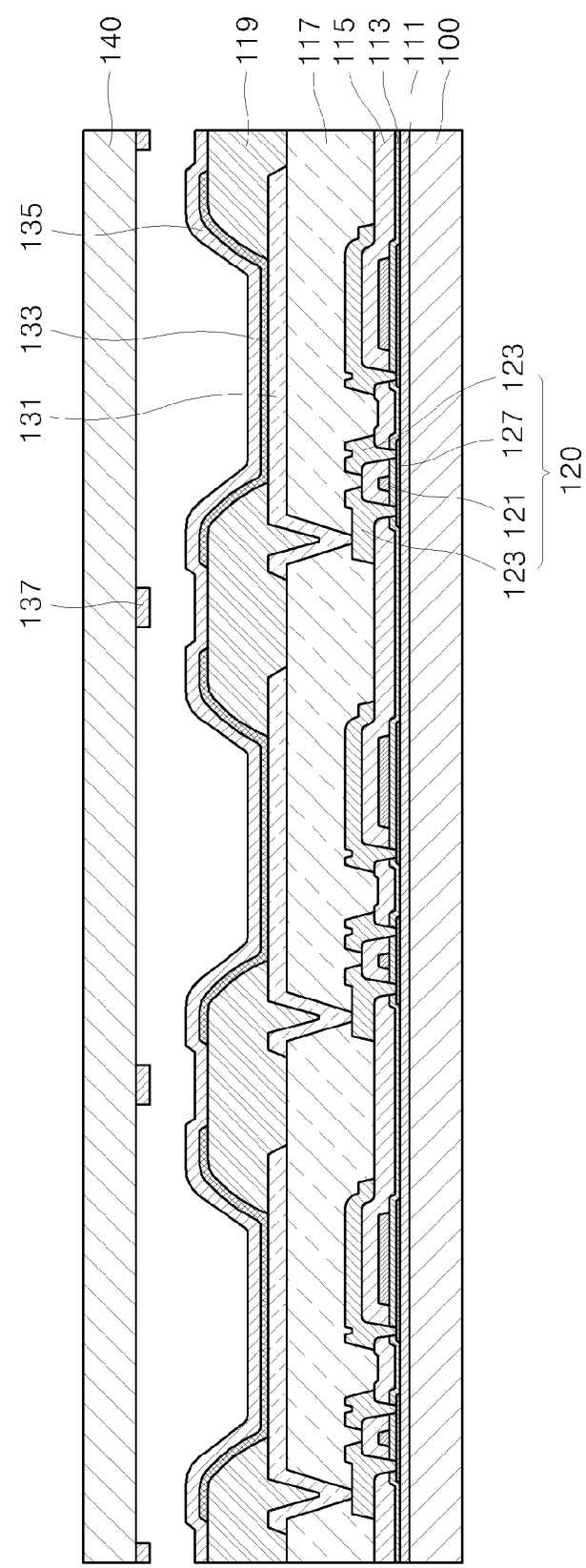
FIG. 7 is a cross-sectional view schematically illustrating another embodiment of a method of manufacturing an organic light emitting display device.
Figure 8:
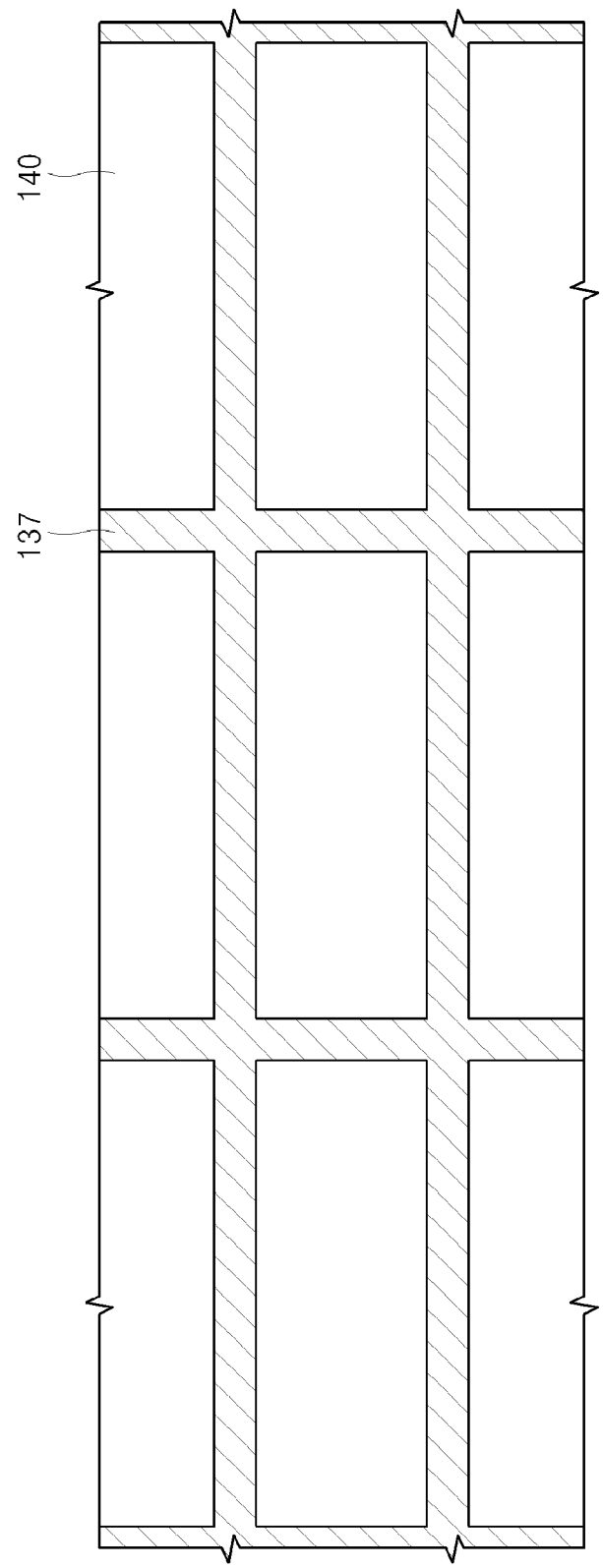
FIG. 8 is a top view schematically illustrating a sealing member and a patterned conductive layer of FIG. 7.

FIG. 7 is a cross-sectional view schematically illustrating a method of manufacturing an organic light emitting display device, according to another embodiment, and FIG. 8 is a plane or top view schematically illustrating a sealing member and a patterned conductive layer of FIG. 7.

In the method of manufacturing an organic light emitting display device according to the current embodiment, the pixel electrode 131 is formed on the substrate 100, the interlayer 133 including the emitting layer is formed on the pixel electrodes 131, and the face electrode 135 is formed on the interlayer 133, thereby completing the manufacture of the lower substrate. The face electrode 135 may be formed by using various methods, for example, deposition of a thin film comprising Ag. Then, a patterned conductive layer 137 is formed on the flexible sealing member 140, thereby completing the manufacture of the upper substrate. When the patterned conductive layer 137 comprises a transparent electrode, such as ITO, or polymers, a sputtering method or a wet process may be used, respectively. The order of forming the upper substrate and forming the lower substrate may be changed. The pattern of the patterned conductive layer 137 may be a pattern corresponding to the edges of the pixel electrodes 131 or a pattern corresponding to gaps between the pixel electrodes 131, as shown in FIG. 8.

Figure 9:
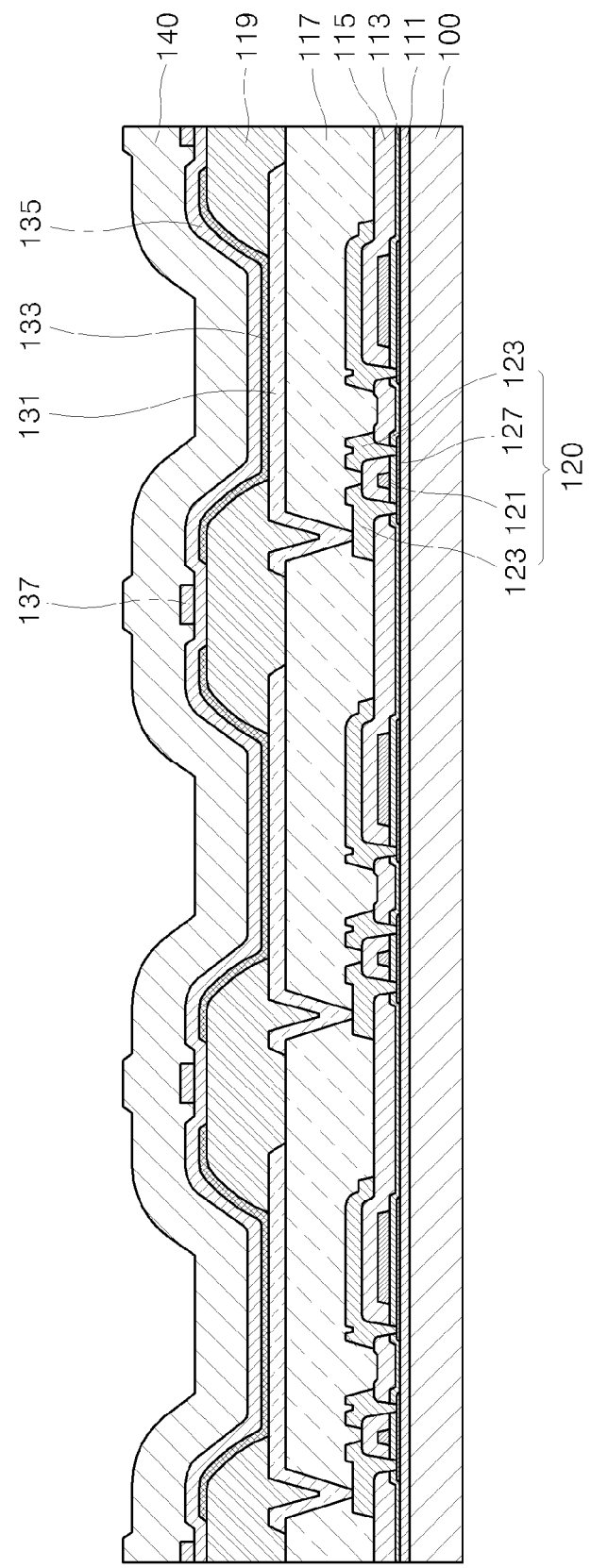
FIG. 9 is a cross-sectional view schematically illustrating another embodiment of an organic light emitting display device.

After the upper substrate and the lower substrate described above are manufactured, the flexible sealing member 140 and the substrate 100 are positioned so that the patterned conductive layer 137 faces the face electrode 135. Then, the flexible sealing member 140 is bent or reshaped along the curvature of the upper portion of the layer below the flexible sealing member 140 at high temperature and high pressure so as to eliminate or prevent a gap between the flexible sealing member 140 and the face electrode 135, and between the patterned conductive layer 137 and the face electrode 135, thereby manufacturing an organic light emitting display device according to another embodiment, as shown in FIG. 9. In such an organic light emitting display device, even though an IR drop may increase in embodiments in which the face electrode 135 comprises an Ag thin film, the patterned conductive layer 137 may function as a patterned auxiliary electrode. Thus, an IR drop in the face electrode 135 may be effectively reduced or prevented. A high temperature and high pressure environment may be formed, for example, by using the chamber as illustrated in FIG. 4.

Moreover, because the patterned conductive layer 137, which functions as the patterned auxiliary electrode, is formed on the sealing member 140, a method of forming the patterned conductive layer 137 is not limited to any one particular method for preventing the interlayer 133 damage, unlike the typical method for manufacturing an organic light emitting display device. Accordingly, the method of forming the patterned conductive layer 137 at low cost and with high yield reduces manufacturing costs of the organic light emitting display device and increases a manufacturing yield.

During formation of the lower substrate, if desired, the PDL 119 covering the edge of the pixel electrode 131 and extending from the pixel electrode 131 may be formed before the interlayer 133 is formed, as shown in FIG. 7. The PDL 119 defines a light emitting area. In this case, the flexible sealing member 140 may be bent or reshaped by high temperature and high pressure to prevent or eliminate a gap between the flexible sealing member 140 and the face electrode 135, and between the flexible sealing member 140 and the PDL 119. Here, when the patterned conductive layer 137 is formed on the flexible sealing member 140 during formation of the upper substrate, before the flexible sealing member 140 and the substrate 100 are bonded to each other, the patterned conductive layer 137 may be patterned to correspond to the upper portion of the PDL 119. In this case, the patterned conductive layer 137, which includes opaque materials such as Cr, not only functions as an auxiliary electrode for the face electrode 135, but also as a black matrix in the organic light emitting display device of FIG. 9.

Moreover, after manufacturing of the lower substrate and the upper substrate is completed, the flexible sealing member 140 and the substrate 100 are positioned in such a manner that the patterned conductive layer 137 faces the face electrode 135 as shown in FIG. 7. Then, the flexible sealing member 140 and the substrate 100 are disposed on the stage 310 and the hot plate 320 is disposed on the flexible sealing member 140 as shown in FIG. 6 so that the flexible sealing member 140 is heated, and consequently bent or reshaped to conform to the curvature or topography of the upper portion or surface of the layer below the flexible sealing member 140. In FIG. 6, the hot plate 320 contacts and heats the flexible sealing member 140. However, in the current embodiment, the stage 310 on which the substrate 100 is disposed may also comprise a hot plate, thereby heating the flexible sealing member 140 through the stage 310.

According to the organic light emitting display device and the method of manufacturing the same, damage to the interlayer including the emitting layer can be prevented and an IR drop in the face electrodes can be reduced.

While the certain embodiments have been particularly shown and described with reference to exemplary embodiments thereof, it will be understood by those of ordinary skill in the art that various changes in form and details may be made therein without departing from the spirit and scope thereof as defined by the following claims.

What is claimed is:

1. A method of manufacturing an organic light emitting display device, the method comprising:
   (a) forming a pixel electrode on a substrate and forming an interlayer comprising an emitting layer on the pixel electrode;
   (b) forming a conductive layer on a flexible sealing member; and
   (c) positioning the flexible sealing member and the substrate with the conductive layer facing the interlayer, and reshaping the flexible sealing member and the conductive layer to conform to an upper surface of a layer below the conductive layer at high temperature and high pressure, thereby substantially eliminating a gap between the conductive layer and the layer below the conductive layer.

2. The method of claim 1, wherein the conductive layer comprises a transparent conductive oxide or a conductive polymer.

3. The method of claim 1, wherein
   step (a) comprises forming a pixel defining layer covering an edge of the pixel electrode and exposing a center of the pixel electrode before forming the interlayer, and
   step (c) comprises reshaping the flexible sealing member to prevent or eliminate a gap between the conductive layer and the interlayer, and between the conductive layer and the pixel defining layer.

4. A method of manufacturing an organic light emitting display device, the method comprising:
   (a) forming a pixel electrode on a substrate and forming an interlayer comprising an emitting layer on the pixel electrode;
   (b) forming a conductive layer on a flexible sealing member; and
   (c) positioning the flexible sealing member and the substrate with the conductive layer facing the interlayer, and heating the flexible sealing member so that the flexible sealing member and the conductive layer conform to an upper surface of a layer below the conductive layer, thereby substantially eliminating a gap between the conductive layer and the layer below the conductive layer.

5. The method of claim 4, wherein the conductive layer comprises a transparent conductive oxide or a conductive polymer.

6. The method of claim 4, wherein
   step (a) comprises forming a pixel defining layer covering an edge of the pixel electrode and exposing a center of the pixel electrode before forming the interlayer, and
   step (c) comprises reshaping the flexible sealing member to prevent or eliminate a gap between the conductive layer and the interlayer, and between the conductive layer and the pixel defining layer.

7. A method of manufacturing an organic light emitting display device, the method comprising:
   (a) forming a pixel electrode on a substrate, forming an interlayer comprising an emitting layer on the pixel electrode, and forming a face electrode on the interlayer;
   (b) forming a patterned conductive layer on a flexible sealing member; and
   (c) positioning the flexible sealing member and the substrate with the patterned conductive layer facing the face electrode, and reshaping the flexible sealing member to conform to an upper surface of a layer below the flexible sealing member at high temperature and high pressure with substantially no gap between the flexible sealing member and the face electrode, and between the patterned conductive layer to and the face electrode.

8. The method of claim 7, wherein the patterned conductive layer comprises a transparent conductive oxide or a conductive polymer.

9. The method of claim 7, wherein
   step (a) comprises forming a pixel defining layer covering an edge of the pixel electrode and exposing a center of the pixel electrode before forming the interlayer, and
   step (c) comprises reshaping the flexible sealing member to prevent or eliminate a gap between the flexible sealing member and the face electrode, and between the flexible sealing member and the pixel defining layer.

10. The method of claim 9, wherein a pattern of the patterned conductive layer corresponds to an upper surface of the pixel defining layer.

11. The method of claim 9, wherein the patterned conductive layer comprises an opaque material.

12. A method of manufacturing an organic light emitting display device, the method comprising:
   (a) forming a pixel electrode on a substrate, forming an interlayer comprising an emitting layer on the pixel electrode, and forming a face electrode on the interlayer;
   (b) forming a patterned conductive layer on a flexible sealing member;
   (c) positioning the flexible sealing member and the substrate with the patterned conductive layer facing the face electrode, and heating the flexible sealing member, thereby reshaping the flexible sealing member to conform to an upper surface of a layer below the flexible sealing member with substantially no gap between the flexible sealing member and the face electrode, and between the patterned conductive layer and the face electrode.

13. The method of claim 12, wherein the patterned conductive layer comprises a transparent conductive oxide or a conductive polymer.

14. The method of claim 12, wherein
   step (a) comprises forming a pixel defining layer covering an edge of the pixel electrode and exposing a center of the pixel electrode before forming the interlayer, and
   step (c) comprises reshaping the flexible sealing member with substantially no gap between the flexible sealing member and the face electrode, and between the flexible sealing member and the pixel defining layer.

15. The method of claim 14, wherein a pattern of the patterned conductive layer corresponds to the upper surface of the pixel defining layer.

16. The method of claim 14, wherein the patterned conductive layer comprises an opaque material.

* * * * *